(12) United States Patent
Kohno

(10) Patent No.: US 9,779,911 B2
(45) Date of Patent: Oct. 3, 2017

(54) ELECTRON MICROSCOPE AND METHOD OF MEASURING ABERRATIONS

(71) Applicant: JEOL Ltd., Tokyo (JP)

(72) Inventor: Yuji Kohno, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/013,192

(22) Filed: Feb. 2, 2016

(65) Prior Publication Data

US 2016/0225580 A1    Aug. 4, 2016

(30) Foreign Application Priority Data

Feb. 3, 2015   (JP) .................................. 2015-19203

(51) Int. Cl.
*H01H 37/28* (2006.01)
*H01J 37/22* (2006.01)
*H01J 37/28* (2006.01)
*H01J 37/153* (2006.01)

(52) U.S. Cl.
CPC .......... *H01J 37/222* (2013.01); *H01J 37/153* (2013.01); *H01J 37/28* (2013.01); *H01J 2237/0453* (2013.01); *H01J 2237/1534* (2013.01); *H01J 2237/221* (2013.01); *H01J 2237/24455* (2013.01); *H01J 2237/24465* (2013.01); *H01J 2237/2802* (2013.01)

(58) Field of Classification Search
CPC ........ H01J 37/153; H01J 37/222; H01J 37/28; H01J 2237/2802; H01J 2237/0453; H01J 2237/1534; H01J 2237/24455; H01J 2237/24465

USPC ......................................................... 250/311
See application file for complete search history.

(56) References Cited

U.S. PATENT DOCUMENTS

| 6,051,834 A | * | 4/2000 | Kakibayashi | ........... | H01J 37/28 |
| | | | | | 250/311 |
| 2004/0183017 A1 | * | 9/2004 | Kamiya | ................... | H01J 37/28 |
| | | | | | 250/311 |
| 2007/0158568 A1 | * | 7/2007 | Nakamura | ............ | H01J 37/153 |
| | | | | | 250/311 |
| 2012/0187292 A1 | * | 7/2012 | Tomimatsu | ........... | H01J 37/244 |
| | | | | | 250/307 |
| 2012/0187293 A1 | * | 7/2012 | Shibata | ................. | H01J 37/244 |
| | | | | | 250/310 |

FOREIGN PATENT DOCUMENTS

| JP | 2011243516 A | 12/2011 |
| JP | 201222971 A | 2/2012 |

* cited by examiner

*Primary Examiner* — Wyatt Stoffa
*Assistant Examiner* — Eliza Osenbaugh-Stewart
(74) *Attorney, Agent, or Firm* — The Webb Law Firm

(57) ABSTRACT

An electron microscope capable of measuring aberrations accurately is provided. The microscope is adapted to obtain scanning transmission electron (STEM) images by detecting electrons transmitted through a sample (S). The microscope (100) includes a segmented detector (20) having a detection surface (23) for detecting the electrons transmitted through the sample (S). The detection surface (23) is divided into detector segments (D1-D16) for detecting the electrons transmitted through the sample (S). The microscope (100) further includes an aperture plate (30) for limiting the active areas of the detector segments (D1-D16) on which the electrons impinge.

10 Claims, 9 Drawing Sheets

ELECTRON MICROSCOPE AND METHOD OF MEASURING ABERRATIONS

BACKGROUND OF THE INVENTION

Field of the Invention

The present invention relates to an electron microscope and also to a method of measuring aberrations.

Description of Related Art

A scanning transmission electron microscope (STEM) is an electron microscope for obtaining scanning transmission electron microscope (STEM) images by scanning a focused electron beam over a sample, detecting a signal arising either from electrons transmitted through the sample or from scattering electrons, and mapping the intensities of the signal in synchronism with the scanning. In recent years, scanning transmission electron microscopes have attracted attention as electron microscopes capable of providing quite high spatial resolutions at the atomic level.

A segmented detector whose detection surface is divided into plural detector segments is known as an electron detector equipped in such a scanning transmission electron microscope. The segmented detector has independent detection systems for the detector segments, respectively. Each detection system detects only electrons striking a respective one of the detector segments on the detection surface. A scanning transmission electron microscope performs imaging while bringing the detection surface into coincidence with the diffraction plane. That is, this is equivalent to detecting electrons transmitted and scattering within a certain solid-angle region from a sample. Consequently, this presents the advantage that the use of a segmented detector permits one to simultaneously measure the solid angle dependence of scattering of electrons caused by the sample and to obtain a quantitative evaluation (see, for example, JP-A-2011-243516).

JP-A-2012-22971 discloses a method of measuring aberrations in a scanning transmission electron microscope equipped with such a segmented detector. In this known method, bright field images are obtained from detector segments, respectively, which are different in position, by the use of the segmented detector. At the same time, dark field images are derived. Aberration coefficients are computed using these simultaneously obtained final images to be observed. In this method of measuring aberrations, a dark field image undergoing a relatively small deviation is used as a position reference and so the accuracy at which the aberration coefficients are calculated can be improved. Aberration correction is made based on the results. Consequently, higher resolution can be accomplished.

The principle of measuring aberrations in a scanning transmission electron microscope is now described. FIG. 9A is a schematic ray diagram of one example of orbit of an electron beam EB from a vicinity of a sample S to a detector 120 (having a detection surface 123) in obtaining a bright field image in the scanning transmission electron microscope.

The sample S is placed at a position remote from the front focal plane 113a of an objective lens 113 by the focal distance. The detector 120 is installed at a position located at a distance equal to the camera length from the sample S. FIG. 9A shows the manner in which the electron beam EB passes through the front focal plane 113a of the objective lens 113 and is converged toward the sample S by the converging action of the objective lens 113.

The angle of convergence α is the angle of incidence of the electron beam EB to the sample S and the azimuthal angle θ is the azimuthal angle of the beam EB on the sample S (see FIG. 9B). Where there is no aberration, the beam EB is focused into one point on the sample S as indicated by the broken line irrespective of the angle of convergence α and the azimuthal angle θ. On the other hand, where there is aberration (geometric aberration), as the angle of convergence α to the sample S increases, the electron beam EB intersects the optical axis 2 more forwardly of the sample S. As the angle of convergence α of the beam increases, the position of incidence of the beam on the sample deviates more from the intended position of incidence of the beam. If this aberration is attributed to the spherical aberration in the objective lens 113, the deviation is proportional to the cube of the angle of convergence α as is well known in the art.

Under such influence of aberration, if an electron beam EB1 that has passed over the optical axis 2 forms a bright field image as shown in FIG. 10A, a bright field image formed by an electron beam EB2 having an angle of convergence α (α≠0) to the sample S involves a positional deviation relative to the bright field image of FIG. 10A as shown in FIG. 10B, because the beam EB2 needs to be shifted further in order to image an atom A (in other words, to irradiate the atom A) due to a deviation of the incident position on the sample caused by the aberration.

That is, plural bright field images formed by electron beams having different angles of convergence α inevitably involve their mutual positional deviations due to aberrations. More specifically, it is assumed that one final image of the sample S is taken as a reference and that the amount of positional deviation of each bright field image of the sample is represented by a positional deviation vector $F_{\alpha,\theta}$. An oppositely directed vector corresponds to a geometric aberration vector $G_{\alpha,\theta}$ indicating an aberration appearing in each bright field image.

On the other hand, the front focal plane (also referred to as the aperture plane) 113a of the objective lens 113 is an angular spatial plane of the electron beam EB. That is, as conceptually illustrated in FIG. 9B, if each position of the electron beam in the front focal plane 113a is represented in terms of polar coordinates, the radial component and the angular component of the position can be represented uniquely by the angle of convergence α and the azimuthal angle θ, respectively. An aberration function χ at the front focal plane 113a is represented as the sum of the following wave aberrations which are a function of these angle of convergence α and azimuthal angle θ. In high-resolution imaging at the atomic level, if the fact that only on-axis aberrations are treated is taken into account, the aberration function χ (α, θ) is given by $\chi(\alpha, \theta)$ = focal deviation (defocus) + two-fold astigmatism + on-axis coma + three-fold astigmatism + spherical aberration + star aberration + four-fold astigmatism + fourth-order coma + three-lobe aberration + five-fold astigmatism + fifth-order spherical aberration + six-fold astigmatism

That is, the aberration function χ (α, θ) is given by the following Eq. (A):

$$\chi(\alpha, \theta) = \frac{1}{2}\alpha^2 o_2 + \frac{1}{2}\alpha^2 a_2 \cos(2(\theta - \theta_{a2})) + \quad (A)$$

-continued $$\frac{1}{2}\alpha^3 p_3\cos(\theta-\theta_{p3}) + \frac{1}{3}\alpha^3 a_3\cos(3(\theta-\theta_{a3})) + \frac{1}{4}\alpha^4 o_4 +$$

$$\frac{1}{4}\alpha^4 q_4\cos(2(\theta-\theta_{q4})) + \frac{1}{4}\alpha^4 a_4\cos(4(\theta-\theta_{a4})) +$$

$$\frac{1}{5}\alpha^5 p_5\cos(\theta-\theta_{p5}) + \frac{1}{5}\alpha^5 r_5\cos(3(\theta-\theta_{r5})) +$$

$$\frac{1}{5}\alpha^5 a_5\cos(5(\theta-\theta_{a5})) + \frac{1}{6}\alpha^6 o_6 + \frac{1}{6}\alpha^6 a_6\cos(6(\theta-\theta_{a6})) +$$

The components $G_\alpha$ and $G_\theta$ of the geometric aberration vector $G_{\alpha,\theta}$ in the direction of the angle of convergence and in the direction of the azimuthal angle, respectively, are obtained by taking the partial differentials of the aberration function $\chi$ with respect to the angle of convergence $\alpha$ and the azimuthal angle $\theta$.

$$G_{\alpha,\theta} = (G_\alpha, G_\theta) = \left(\frac{\lambda}{2\pi}\frac{\partial\chi}{\partial\alpha}, \frac{\lambda}{2\pi}\frac{1}{\alpha}\frac{\partial\chi}{\partial\theta}\right) \quad (B)$$

That is, a bright field image is obtained for each of plural combinations of values of the angle of convergence $\alpha$ and the azimuthal angle $\theta$. This gives rise to as many geometric aberration vectors $G_{\alpha,\theta}$ as the number of these combinations. Then, aberration coefficients can be calculated by mathematically processing (e.g., applying a least squares method to) these vectors.

With respect to the angle of convergence $\alpha$ and the azimuthal angle $\theta$ of the electron beam, the position of the beam on the detection surface, for example, should be identified. For example, a multi-segmented detector is prepared which has multiple detector segments providing different detection positions with which the convergence angle $\alpha$ and the azimuthal angle $\theta$ are associated. Bright field images are obtained simultaneously from an electron beam incident on the individual detector segments of the detector together with positional information about the detection surface (i.e., angular information (convergence angle $\alpha$ and azimuthal angle $\theta$) about the electron beam EB incident on the detector segments). Plural geometric aberration vectors $G_{\alpha,\theta}$ are computed for these bright field images. Since each aberration is a function having convergence angle $\alpha$ and azimuthal angle $\theta$ (radial component and angular component at the front focal plane) as variables, it is necessary to divide the detector segments at least into two groups for both variables.

As the number of geometric aberration vectors $G_{\alpha,\theta}$ needed to calculate each aberration coefficient is increased (i.e., as the number of detector segments is increased), aberrations of low orders can be computed at higher accuracy.

FIG. 11 schematically illustrates a method of measuring aberrations in a scanning transmission electron microscope equipped with a segmented detector. As shown, an electron beam EB is focused onto a sample S. If aberrations are present in the illumination system, the incident position on the sample S varies for each different convergence angle and so the beam is not focused into one point.

FIG. 12A is a bright-field STEM image obtained from a detector segment D1. FIG. 12B is a bright-field STEM image obtained from a detector segment D2. FIG. 12C is a bright-field STEM image obtained from a detector segment D3.

If bright-field STEM images are captured by a segmented detector having the plural detector segments D1, D2, and D3, the angle of incidence of the detected electron beam EB differs among the different detector segments D1, D2, and D3. Therefore, the incident position of the electron beam EB on the sample S deviates according to the amount of deviation in the illumination system as shown in FIG. 11. As a result, the whole bright-field STEM image shifts as shown in FIGS. 12A-12C. Aberration coefficients can be computed from this image shift.

FIG. 13 is a schematic plan view of one example of the segmented detector 120. In this detector 120, each of detector segments D1-D4 has a sectorial shape, for example, as shown. If aberrations are measured in these detector segments D1-D4, the resulting images are blurred because these segments D-D4 are spread greatly (i.e., the angle of incidence is spread greatly). This makes it difficult to compute the amount of movement of each image accurately. Especially, the sectorial detector segments are spread much circumferentially and, therefore, if there are high-order aberrations of angular symmetry, the images are blurred conspicuously.

SUMMARY OF THE INVENTION

In view of the foregoing problems, the present invention has been made. One object associated with some aspects of the invention is to provide an electron microscope capable of measuring aberrations accurately. Another object associated with some aspects of the invention is to provide a method capable of measuring aberrations accurately.

(1) An electron microscope associated with the present invention is adapted to obtain scanning transmission electron microscope (STEM) images by detecting electrons transmitted through a sample. The electron microscope has: a segmented detector having a detection surface for detecting the electrons transmitted through the sample, the detection surface being divided into a plurality of detector segments; and an aperture for limiting active areas of the detector segments on which the electrons impinge.

In this electron microscope, STEM images obtained by the detector segments can be suppressed from becoming blurred by limiting the active areas of the detector segments of the segmented detector by the aperture. Consequently, aberrations can be measured accurately. Furthermore, in this electron microscope, by limiting the active areas of the detector segments of the segmented detector on which electrons impinge by means of the aperture, the angular resolution of the segmented detector can be improved and thus aberrations can be measured up to higher orders.

(2) In one feature of this electron microscope, the aperture has openings that may be formed in a corresponding manner to the detector segments.

(3) In one feature of this electron microscope set forth in (2), the openings of the aperture may be smaller in size than their respective detector segments.

In this electron microscope, the active areas of the detector segments on which electrons impinge can be determined by the aperture openings.

(4) In a further feature of the electron microscope set forth in (2) above, the detection surface is angularly divided into N sectorial portions (where N is a positive integer) and concentrically divided into M (where M is a positive integer) layers about an optical axis, whereby the detector segments are N×M in number.

(5) In a further feature of the electron microscope set forth in (4), the openings in the aperture may include N openings corresponding to the N detector segments arranged in the m-th layer (where m=1, 2, . . . , M) as counted from the optical axis. The openings in the aperture may be angularly spaced 360/N degrees from each other.

(6) In a still other feature of the electron microscope set forth in (5), the angularly spaced N aperture openings corresponding to the N detector segments disposed in the m-th layer as counted from the optical axis are angularly shifted by 180/N degrees with respect to the angularly spaced N aperture openings corresponding to the N detector segments disposed in the (m−1)-th layer as counted from the optical axis.

In this electron microscope, aberrations can be measured up to higher orders, for example, as compared with the case where no aperture is used.

(7) In a yet other feature of the electron microscope set forth in (5), the angularly spaced N aperture openings corresponding to the N detector segments disposed in the m-th layer as counted from the optical axis may not be angularly shifted with respect to the angularly spaced N aperture openings corresponding to the N detector segments located in the (m−1)-th layer as counted from the optical axis.

In this electron microscope, aberrations of low orders can be measured accurately.

(8) In another feature of the electron microscope set forth in (1), the aperture may be used for measuring aberrations.

(9) In a further feature of the electron microscope set forth in (1), there may be further provided an arithmetic section for finding aberrations, based on STEM images captured from the detector segments, respectively, while limiting the active areas of the detector segments on which the electrons impinge by use of the aperture.

(10) A method associated with the present invention to measure aberrations is adapted to measure aberrations in an electron microscope equipped with a segmented detector having a detection surface divided into a plurality of detector segments. The method starts with limiting active areas of the detector segments on which electrons transmitted through a sample impinge, by use of apertures. STEM images are obtained from the detector segments, respectively. Then, the aberrations are found from the obtained STEM images.

In this method of measuring aberrations, the active areas of the detector segments of the segmented detector on which electrons impinge are limited by the aperture, thus reducing blurring of the STEM images obtained from the individual detector segments. Consequently, aberrations can be measured accurately. Furthermore, in this method of measuring aberrations, the active areas of the detector segments on which the electrons impinge are limited by the apertures, thus improving the angular resolution of the segmented detector. Hence, aberrations can be measured up to higher orders.

(11) In one feature of the method set forth (10) above, the step of obtaining STEM images from the detector segments, respectively, may comprise the steps of: obtaining STEM images from the detector segments, respectively, while limiting the active areas of the detector segments by use of a first aperture; and obtaining STEM images from the detector segments, respectively, while limiting the active areas of the detector segments by use of a second aperture having aperture openings arranged differently from the aperture openings in the first aperture.

In this measuring method, the use of the first and second apertures makes it possible to measure various aberrations, for example, easily and accurately. Furthermore, if the segmented detector has only a small number of detector segments, even aberrations of higher orders can be measured by using the first and second apertures which are different in aperture opening arrangement.

DESCRIPTION OF THE INVENTION

The preferred embodiments of the present invention are hereinafter described in detail by referring to the accompanying drawings. It is to be understood that the embodiments provided below do not unduly restrict the scope and content of the present invention delineated by the appended claims and that not all the configurations described below are essential constituent components of the invention.

1. Electron Microscope

Figure 1:
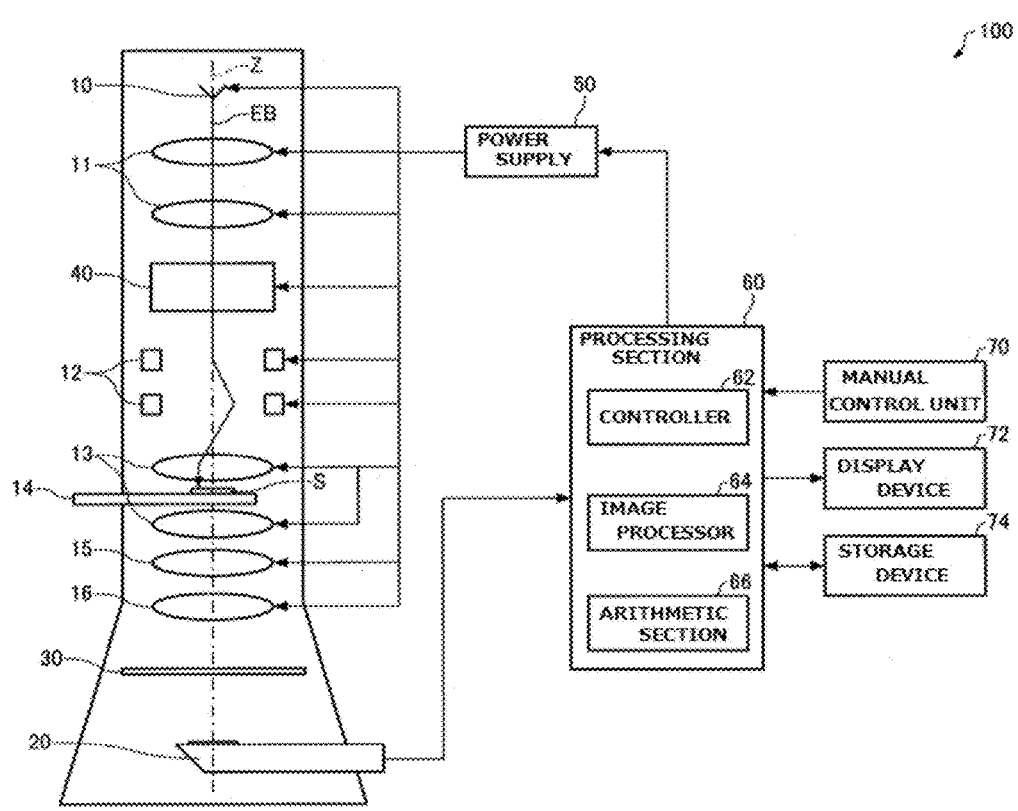
FIG. 1 is a schematic representation, partly in block form, of an electron microscope associated with one embodiment of the present invention.

An electron microscope associated with one embodiment of the present invention is first described by referring to FIG. 1, which schematically shows the configuration of the electron microscope, generally indicated by reference numeral 100.

As shown in FIG. 1, the electron microscope 100 includes an electron beam source 10, an illumination lens system 11, a deflector assembly 12, an objective lens assembly 13, a sample stage 14, an intermediate lens 15, a projector lens 16, a segmented detector 20, an aperture plate 30 for measuring aberrations, an aberration corrector 40, a power supply 50, a processing section 60, a manual control unit 70, a display device 72, and a storage device 74.

The electron beam source 10 emits an electron beam EB. For example, a thermionic-emission electron gun, thermal field emission electron gun, cold cathode field-emission electron gun, or other electron gun can be used as the electron beam source 10.

The illumination lens system 11 focuses the electron beam EB produced by the electron beam source 10. The deflector assembly 12 deflects the beam EB. The focused electron beam EB can be scanned over a sample S by supplying a scan signal from the power supply 50 to the deflector assembly 12. Consequently, the electron microscope 100 can be operated as a scanning transmission electron microscope (STEM).

The aberration corrector 40 can reduce aberrations, and is incorporated in the illumination system of the electron microscope 100. The aberration corrector 40 is configured including aberration correcting elements such as quadrupoles and hexapoles.

The objective lens assembly 13 operates to focus the electron beam EB onto the sample S and to image the electrons transmitted through the sample S.

The sample stage 14 holds the sample S. Furthermore, the sample stage 14 can move the sample S horizontally or vertically and tilt the sample S.

The intermediate lens 15 focuses the back focal plane (diffraction plane) of the objective lens assembly 13 onto the object plane of the projector lens 16. The projector lens 16 brings the image plane of the intermediate lens 15 into focus on the detection surface 23 of the segmented detector 20. In the electron microscope 100, a scanning transmission electron microscope (STEM) image is taken while bringing the detection surface 23 of the segmented detector 20 into coincidence with the diffraction plane.

Figure 2:
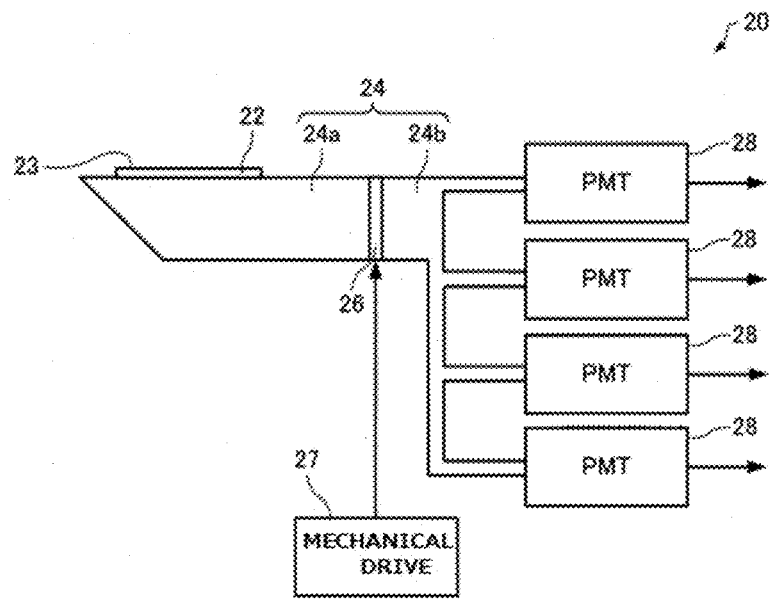
FIG. 2 is a schematic representation of a segmented detector shown in FIG. 1.
Figure 3:
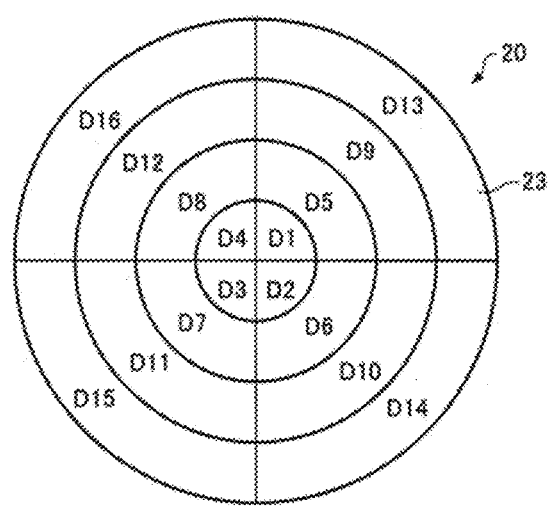
FIG. 3 schematically shows the detection surface of the segmented detector shown in FIG. 2.

The segmented detector 20 is mounted behind (on the downstream side relative to the direction of the electron beam EB) the projector lens 16. The detector 20 has the detection surface 23 for detecting electrons transmitted through the sample S, the detection surface being divided into a plurality of detector segments. FIG. 2 schematically shows the configuration of the segmented detector 20. FIG. 3 schematically shows the detection surface 23 of the detector 20.

As shown in FIGS. 2 and 3, the segmented detector 20 has an electron-to-light converter 22 for converting the electron beam into light, an optical transmission pathway 24 for dividing the electron-to-light converter 22 into a plurality of detector segments D1-D16 and conveying the light streams from the detector segments, and a plurality of light detectors 28 for converting the light streams from the detector segments D1-D16 into their respective electric signals.

The electron-to-light converter 22 is a scintillator or fluorescent screen, for example, and converts the incident electrons into light of intensity that can be detected by the following stage of light detectors 28.

The optical transmission pathway 24 is a bundle of multiple optical fibers. The ends of the fibers on the converter (22) side are bound together to receive light from the whole surface of the electron-to-light converter 22. The ends of the fibers on the opposite side branch into individual fibers to transfer the received light streams to the respective light detectors 28 according to the positions of incidence of the light streams. That is, the optical transmission pathway 24 is so designed that the light-emitting surface of the electron-to-light converter 22 acts as the detection surface 23 providing the detector segments D1-D16 which are different in position and with which the convergent angle α and azimuthal angle θ are associated.

The optical transmission pathway 24 has a rotary portion 26 for rotating the detector segments D1-D16 within the electron beam incident plane of the electron-to-light converter 22 by varying the light transmission path. The optical transmission pathway 24 is composed of an optical transmission line 24a disposed on the vacuum side and an optical transmission line 24b disposed on the atmospheric side. The transmission lines 24a and 24b are connected together by the rotary portion 26 so as to be rotatable relative to each other. The rotary portion 26 can rotate the optical transmission line 24b about the center axis of the whole optical transmission pathway 24 while maintaining the central axis of the optical transmission pathway 24 unchanged. As a consequence, the detector segments D1-D16 can be rotated.

A mechanical drive 27 can actuate the rotary portion 26, thus rotating the optical transmission line 24b.

Each of the light detectors 28 is a composite device of a photomultiplier tube (PMT) and a preamplifier, for example. The light detectors 28 convert the light streams going out of the branching ends of the optical transmission pathway 24 into electric signals and amplify them. The amplified signals are applied as detection signals to the processing section 60, the detection signals representing the electron beam segments incident on the detector segments D1-D16, respectively.

As described previously, each aberration is a function having variables including the convergent angle α and the azimuthal angle θ (which are a radial component and an angular component, respectively, in the front focal plane). Therefore, the detection surface needs to be divided into at least two parts for both variables. On the other hand, as the number of geometric aberration vectors $G_{\alpha,\theta}$ necessary for computation of each aberration coefficient is increased, aberrations of low orders can be computed at higher accuracy. Accordingly, the optical transmission pathway 24 divides the emissive surface of the electron-to-light converter 22 at regular intervals angularly (circumferentially) and concentrically. In the example shown in FIG. 3, the emissive surface is divided into four in the azimuthal direction and into four in the direction of the convergent angle. The detection surface 23 of the electron-to-light converter 22 is divided into 16, i.e., the detector segments D1-D16. In this case, the number of the branching ends of the optical transmission pathway 24 is 16. Also, the number of the light detectors 28 is 16.

The detection surface 23 of the segmented detector 20 is not restricted to the above example. For example, the detection surface 23 may be angularly divided into N sectorial portions (where N is a positive integer) about the optical axis 2 and concentrically into M layers or zones (including a circle and annular portions) (where M is a positive integer) such that N×M detector segments D1-D16 (N×M) result (in the example shown in FIG. 3, N=4 and M=4).

The aperture plate 30 for measuring aberrations is located above the segmented detector 20. The aperture plate 30 is so designed that it can be inserted into and retracted from the optical axis 2. In the electron microscope 100, when STEM imaging is performed to measure aberrations, the aperture plate 30 for measurement of aberrations is inserted. On the other hand, when STEM imaging is done to observe the sample S, the aperture plate 30 is retracted.

Figure 4:
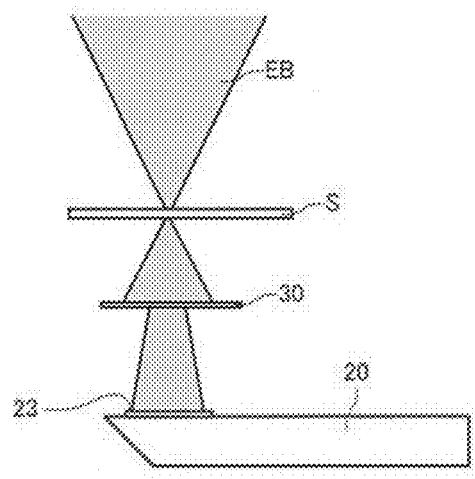
FIG. 4 schematically shows the manner in which an aperture for aberration measurements has been inserted in the microscope shown in FIG. 1.

FIG. 4 schematically shows the state of the electron microscope 100 in which the aperture plate 30 for use for measuring aberrations has been inserted.

As shown in FIG. 4, the aperture plate 30 for measuring aberrations is positioned above the segmented detector 20 having the detection surface 23. Electrons passed through the aperture plate 30 impinge on the detection surface 23 of the segmented detector 20.

Figure 5:
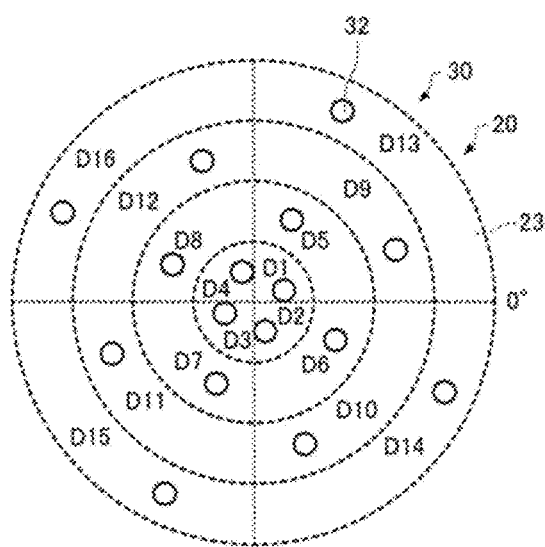
FIG. 5 is a schematic view of the detection surface of the segmented detector shown in FIGS. 1-4, taken from the incident direction of an electron beam, and in which the aberration measurement aperture shown in FIG. 4 has been inserted in the electron microscope shown in FIG. 1.

FIG. 5 is a schematic view of the detection surface 23 of the segmented detector 20, taken from the incident direction of an electron beam, and in which the aperture plate 30 for use for measurement of aberrations has been inserted.

The aperture plate 30 for measuring aberrations has a plurality of aperture openings 32 which are formed correspondingly to the detector segments D1-D16, respectively. In the example shown in FIG. 5, the aperture openings 32 are 16 in number and correspond in a one-to-one relationship to the detector segments D1-D16. The aperture openings 32 are smaller in size (area) than their respective detector segments D1-D16. The detector segments D1-D16 detect only electrons passed through their respective detector aperture openings 32. That is, the active areas of the detector segments D1-D16 on which electrons impinge can be determined by the aperture openings 32. Consequently, the angular resolution of the segmented detector 20 can be enhanced.

In the segmented detector 20, as the aperture openings 32 are reduced in size, the angular resolution is improved but the amount of signal detected decreases. This in turn impairs the signal-to-noise ratio. For this reason, the sizes of the aperture openings 32 are appropriately set according to the required resolution and S/N ratio.

The arrangement of the aperture openings 32 in the aperture plate 30 for measuring aberrations is now described. For example, where the aperture plate 30 for measuring aberrations has the N aperture openings 32 corresponding to the N detector segments arranged in the m-th layer (m=1, 2 . . . , M) as counted from the optical axis 2 (i.e., the center of the detection surface 23) as shown in FIG. 5, the aperture openings 32 are angularly spaced from each other by 360/N degrees. More specifically, in FIG. 5, the four aperture openings 32 corresponding to the 4 detector segments D1-D4 arranged in the first layer are arranged at angular intervals of 90 degrees (360/4 degrees). Similarly, in any other layer, the four aperture openings 32 corresponding to the four detector segments D5-D8, D9-D12, or D13-D16 are disposed at intervals of 90 degrees.

The N aperture openings 32 corresponding to the N detector segments arranged in the m-th layer as counted from the optical axis 2 are angularly shifted by 180/N degrees with respect to the angularly spaced N aperture openings 32 corresponding to the N detector segments located in the (m−1)-th layer as counted from the optical axis 2. More specifically, in FIG. 5, the 4 aperture openings 32 corresponding to the four detector segments D5-D8 arranged in the second layer are angularly shifted by 45 degrees (180/4 degrees) with respect to the angularly spaced 4 aperture openings 32 corresponding to the 4 detector segments D1-D4 arranged in the first layer as counted from the optical axis 2. Assuming that the boundary between the detector segments D1 and D2 lies at 0 degree, the 4 aperture openings 32 corresponding to the detector segments D5-D8 are arranged at 65 degrees, 155 degrees, 245 degrees, and 335 degrees, respectively. The four aperture openings 32 corresponding to the detector segments D1-D4 are at 20 degrees, 110 degrees, 200 degrees, and 290 degrees, respectively. The angular arrangement of the aperture openings 32 in the third layer has a similar relationship to those in the fourth layer. Also, the angular arrangement of the aperture openings 32 in the second layer has a similar relationship to those in the third layer.

Figure 6:
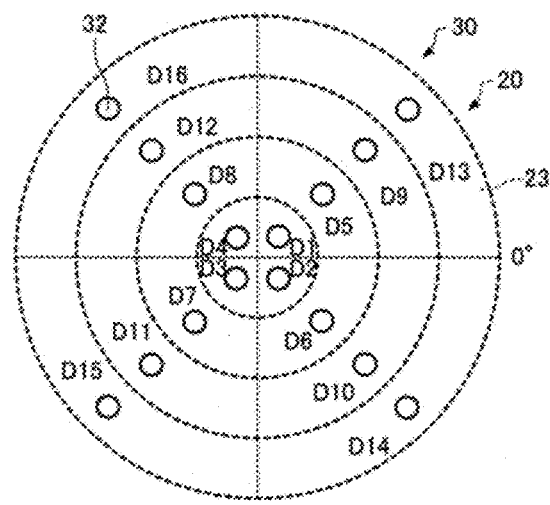
FIG. 6 is a schematic view of one modified arrangement of aperture openings used for aberration measurements.

FIG. 6 is a view similar to FIG. 5, but schematically showing a modified example of the arrangement of the aperture openings 32 in the aperture plate 30 for use for measuring aberrations. For example, if the aperture plate 30 for measuring aberrations has N aperture openings 32 corresponding to the N detector segments arranged in the m-th layer as counted from the optical axis 2, the N aperture openings 32 corresponding to the N detector segments disposed in the m-th layer as counted from the optical axis 2 are not angularly shifted with respect to the N aperture openings 32 corresponding to the N detector segments located in the (m−1)-th layer as counted from the optical axis 2 as shown in FIG. 6. In particular, in FIG. 6, as an example, the 4 aperture openings 32 corresponding to the 4 detector segments D5-D8 arranged in the second layer are not angularly shifted with respect to the 4 aperture openings 32 corresponding to the 4 detector segments D1-D4 arranged in the first layer as counted from the optical axis 2. Assuming that the boundary between the detector segments D1 and D2 is at 0 degree, the 4 aperture openings 32 corresponding to the detector segments D5-D8 are arranged at 45 degrees, 135 degrees, 225 degrees, and 315 degrees, respectively. Similarly, the 4 aperture openings 32 corresponding to the detector segments D1-D4 are located at 45 degrees, 135 degrees, 225 degrees, and 315 degrees, respectively. The angular arrangement of the aperture openings 32 in the third layer has a similar relationship to that of the aperture openings 32 in the fourth layer. The angular arrangement of the aperture openings 32 in the second layer has a similar relationship to that of the aperture openings 32 in the third layer. That is, in the present modified example, the angular arrangement of the aperture openings 32 is the same for all of the first through fourth layers.

Figure 7:
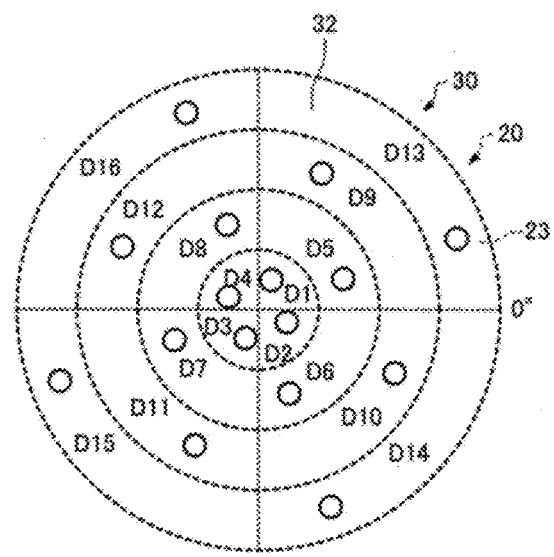
FIG. 7 is a schematic view of another modified arrangement of aperture openings used for aberration measurements.

FIG. 7 is a view similar to FIG. 5, but schematically showing another modification of the arrangement of the aperture openings 32 in the aperture plate 30 for use for measuring aberrations. In the example shown in FIG. 7, the aperture openings 32 in the aperture plate 30 for measuring aberrations are angularly shifted by a given angle (45 degrees in the illustrated example) about the optical axis 2 with respect to the aperture openings 32 shown in FIG. 5.

In the electron microscope 100, the aperture plate 30 for measuring aberrations and shown in the above-referenced FIGS. 5 and 7 is mounted replaceably. This makes it possible to make a measurement while using a different type of the aperture plate 30 for use for measuring aberrations depending on the type of aberration to be measured as described later. As an example, the electron microscope 100 may have a movable aperture structure incorporating the aberration measuring aperture plates 30 shown respectively in FIGS. 5-7. The arrangement of the aperture openings 32 may be switchable from outside of the vacuum.

Furthermore, in the electron microscope 100, the aperture plate 30 for use for measuring aberrations may be mounted so as to be rotatable about the optical axis 2. In particular, the electron microscope 100 may have a rotary drive mechanism (not shown) for rotating the aperture plate 30 for measuring aberrations. The arrangement of the aperture openings 32 shown in FIG. 5 may be changed to a desired arrangement such as the arrangement of the aperture openings 32 shown in FIG. 7 by rotating the aperture plate 30 through a desired angle by means of this rotary drive mechanism.

Referring back to FIG. 1, the power supply 50 applies voltages or currents to the electron beam source 10, the electron optics components 11, 12, 13, 15, 16, 40, and the mechanical drive 27 (see FIG. 2) for the segmented detector 20 in response to control signals from a controller 62.

The manual control unit 70 obtains a control signal responsive to a user's manipulation and performs processing to send the signal to the processing section 60. For example, the manual control unit 70 is composed of buttons, keys, a touch panel display, a microphone, or the like. The manual control unit 70 accepts input values, for example, indicative of a final magnification and a field of view from the user.

The display device 72 displays images generated by the processing section 60. The function of the display device 72 can be implemented by an LCD, a CRT, or the like. For example, the display device 72 displays an STEM image generated by an image processor 64.

The storage device 74 acts as a working area for the processing section 60 and can be implemented by a RAM or the like. The storage device 74 stores programs, data, and related information permitting the processing section 60 to perform various kinds of control operations and computational operations. The storage device 74 is also used to temporarily store the results of calculations executed by the processing section 60 in accordance with various programs.

The processing section 60 performs various kinds of control operations and computational operations in accordance with programs stored in the storage device 74. The processing section 60 acts as the controller 62, the image processor 64, and an arithmetic section 66 described below by executing programs stored in the storage device 74. The functions of the processing section 60 can be implemented by hardware such as various processors (e.g., CPU, DSP, or the like) or ASIC (e.g., a gate array) or software. At least a part of the processing section 60 may be implemented by hardware (dedicated circuitry).

The processing section 60 includes the controller 62, the image processor 64, and the arithmetic section 66. The controller 62 performs processing to control output voltages or output currents from the power supply 50 for applying voltages or currents to the electron beam source 10, to the electron optics components 11, 12, 13, 15, 16, and 40 constituting the electron microscope 100, and to the mechanical drive 27 for the segmented detector 20.

The image processor 64 performs processing to generate STEM images using the output signal from the segmented detector 20. For example, the image processor 64 operates to create a bright-field STEM image for each of the detector segments D1-D16 of the segmented detector 20. The created bright-field STEM images for the detector segments D1-D16, respectively, are stored in the storage device 74 together with information about convergent angle α and azimuthal angle θ associated with the detector segments D1-D16. When the aperture plate 30 for measuring aberrations is inserted, the convergent angle α and azimuthal angle θ are made to assume values associated with the positions of the aperture openings 32 (i.e., incident positions at which electrons passed through the respective aperture openings 32 hit the detector segments D1-D16) corresponding to the detector segments D1-D16.

The arithmetic section 66 performs processing to calculate aberrations from the bright-field STEM images derived respectively from the detector segments D1-D16. The arithmetic section 66 reads the bright-field STEM images from the storage device 74 and mathematically processes the images (e.g., using a cross-correlation technique) to compute relative positional deviations among the bright-field STEM images. The arithmetic section 66 creates combinations of values of the convergent angle α and azimuthal angle θ and vectors representing the obtained positional deviations among the bright-field STEM images, selects a desired number of combinations from these created combinations, and performs mathematical processing (e.g., applying a least squares method) to compute aberration coefficients of geometric aberrations.

The controller 62 controls excitation currents supplied to the aberration correcting elements of the aberration corrector 40 on the basis of the aberration coefficients computed by the arithmetic section 66. Consequently, aberrations can be reduced.

2. Method of Measuring Aberrations

A method associated with another embodiment of the present invention to measure aberrations by the use of the electron microscope 100 is next described by referring to some drawings.

A method of measuring aberrations is first described. The amount of shift of an image occurring in a case where there are aberrations generally encountered can be given by the following Eq. (1).

$$u = c_1\omega + a_1\bar{\omega} + \frac{2}{3}b_2\omega\bar{\omega} + \frac{1}{3}\bar{b}_2\omega^2 + a_2\bar{\omega}^2 + \qquad (1)$$
$$c_3\omega^2\bar{\omega} + \frac{3}{4}s_3\omega\bar{\omega}^2 + \frac{1}{4}\bar{s}^3\omega^3 + a_3\omega^3 + \frac{3}{5}b_4\omega^2\bar{\omega}^2 +$$
$$\frac{2}{5}\bar{b}_4\omega^3\bar{\omega} + \frac{4}{5}d_4\omega\bar{\omega}3 + \frac{1}{5}\bar{d}_4\omega^4 + a_4\bar{\omega}^4 + c_5\omega^3\bar{\omega}^2 + a_5\omega^5 +$$

where ω is a complex incident angle to the sample S.

It is considered that main aberrations which vary when the field of view is changed, for example, under the condition where aberrations are corrected by the aberration corrector 40 are $c_1$ and $a_1$ and that the other aberrations can be neglected. In this case, first-order aberrations $c_1$ and $a_1$ can be measured from four bright-field STEM images obtained from the detector segments (such as the detector segments D1-D4 shown in FIG. 5) which lies in one layer and which are spaced from each other by 90 degrees equidistantly from the optical axis 2.

Where there are bright-field STEM images more than needed to determine aberration coefficients, the measuring accuracy can be improved using a least squares method or other method.

Where it is considered that second-order aberrations $b_2$ and $a_2$ remain in addition to the first-order aberrations, the aberrations can be measured using 8 bright-field STEM images obtained from detector segments in two layers (e.g., the detector segments D1-D4 in the first layer and the detector segments D5-D8 in the second layer shown in FIG. 5).

Where aberrations of still higher orders remain, the arrangement of detector segments in each layer is important. For example, if the detector segments D1-D16 are limited using the aberration-measuring aperture plate 30 in which the aperture openings 32 are angularly arranged identically for all the layers as shown in FIG. 6, the angular dependence of $c_3$ is the same as for $a_3$. Also, the angular dependence of $b_4$ is the same as for $d_4$. As a consequence, they cannot be separated. On the other hand, if the detector segments D1-D4 are limited using the aberration-measuring aperture plate 30 in which the aperture openings 32 are angularly arranged differently among the different layers as shown in FIG. 5, there occurs a phase deviation between the first and third layers. Also, there occurs a phase deviation between the second and fourth layers. Consequently, these aberration coefficients $c_3$, $a_3$, $b_4$, and $d_4$ can be calculated. Furthermore, if the aperture plate 30 for measuring aberration is rotated through 45 degrees as shown in FIG. 7, for example, from the state shown in FIG. 5, the phase of linear coupling coefficients of aberrations rotates through 180 degrees and so the aberrations can be separated easily.

When the detector segments D1-D16 have been limited by the use of the aberration-measuring aperture plate 30 shown in FIG. 5, third-order aberration coefficients $c_3$, $s_3$, and $a_3$ can be measured from 12 bright-field STEM images derived from three layers of detector segments (such as detector segments D1-D4, D5-D8, and D9-D12). All of the aberrations appearing in Eq. (1) above can be separated in 16 bright-field STEM images obtained from the four layers of detector segments D1-D16.

In an electron microscope not equipped with the aberration corrector 40, if third-order aberrations other than $c_3$ are negligible, aberrations up to the third order can be determined from 8 bright-field STEM images derived from two layers of detector segments while limiting the detector segments D1-D16 using the aberration-measuring aperture plate 30 shown in FIG. 5.

A bright-field STEM can be obtained as if to rotate the detector segments D1-D16 through 45 degrees, by taking an image using the aberration-measuring aberration 30 shown in FIG. 7 after an image is taken using the aberration-measuring aperture plate 30 shown in FIG. 5. In this way, the same bright-field STEM image can be obtained without rotating the detector segments D1-D16 as when the detector segments D1-D16 are rotated, by selectively using plural aperture plates 30 for measuring aberrations. Consequently, aberration coefficients of high orders can be measured easily.

Under circumstances where plural aberrations of higher orders remain, the aperture (not shown) in the illumination system is increased or the camera length is appropriately controlled. Then, the aberration coefficients are measured. The aberrations are corrected by the aberration corrector 40. After correcting the aberrations of higher orders, aberrations of low orders are measured under conditions close to the final imaging conditions including aperture size and camera length, and corrections are made.

Figure 8:
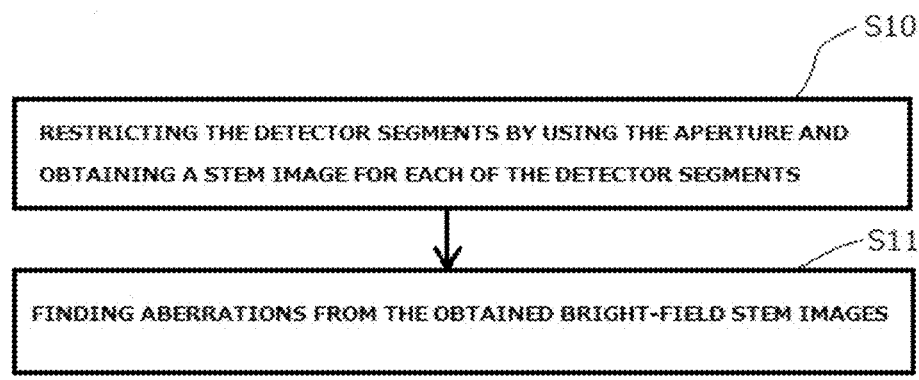
FIG. 8 is a flowchart illustrating a method associated with one embodiment of the invention to measure aberrations by the use of an electron microscope.
Figure 9B:
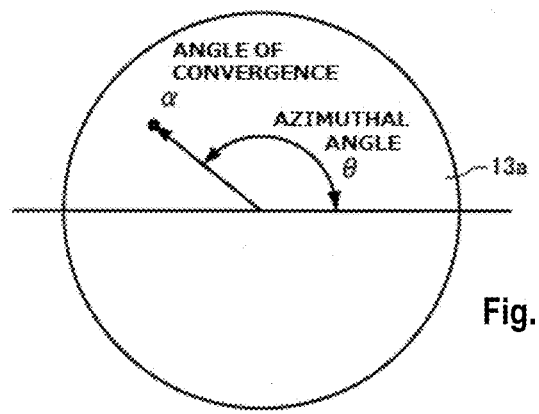
FIG. 9A is an electron ray diagram of one example of orbit of an electron beam from a vicinity of a sample to a detector in obtaining a bright field image by a scanning transmission electron microscope and FIG. 9B is a diagram illustrating convergence angles and azimuthal angles.
Figure 9A:
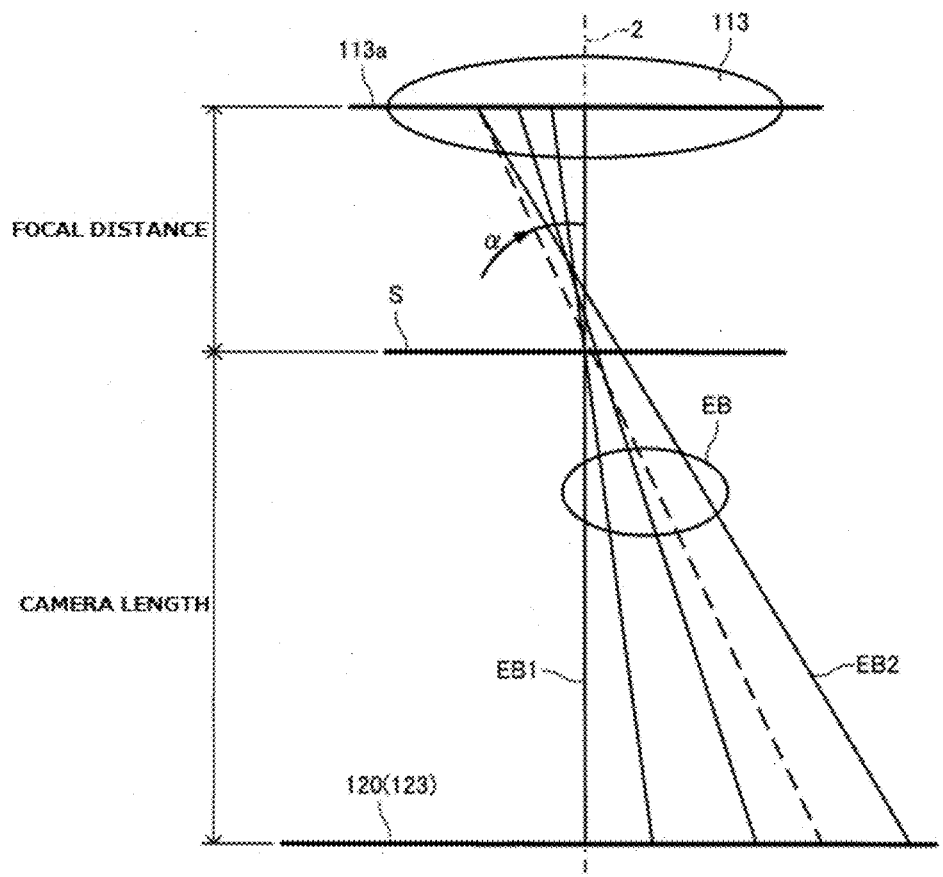
Figure 10:
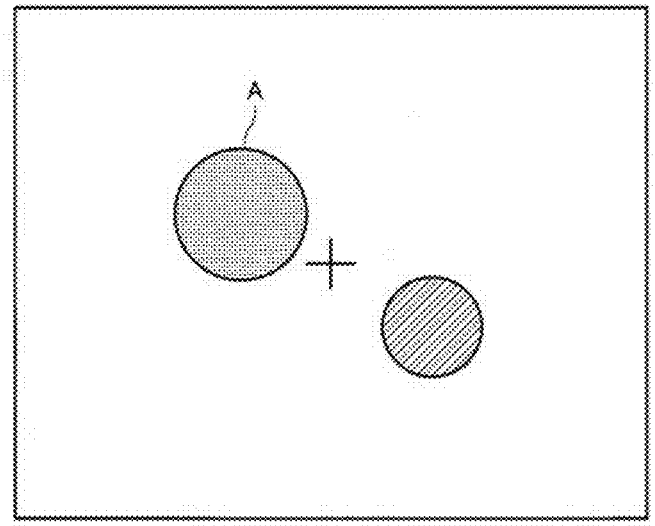
FIG. 10A schematically shows a bright field image formed by an electron beam passed over an optical axis.
FIG. 10B schematically shows a bright field image formed by an electron beam impinging on a sample at a convergent angle α.
Figure 10:
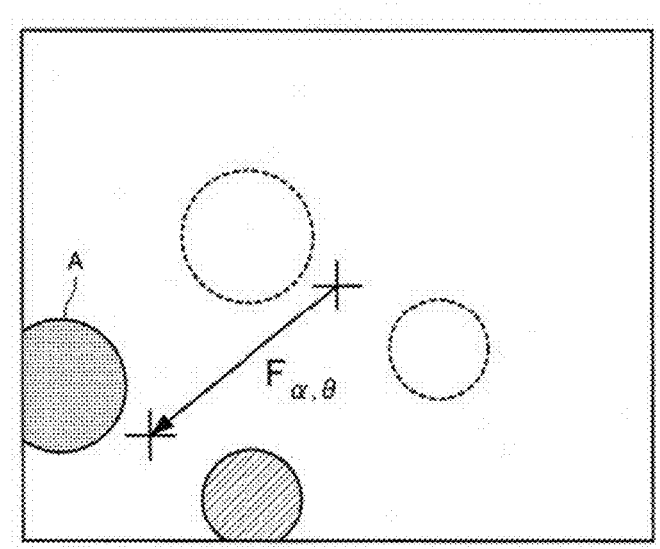
Figure 11:
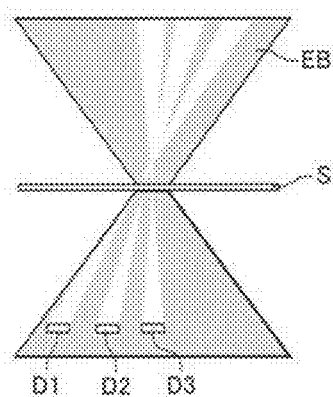
FIG. 11 schematically illustrates a method of measuring aberrations in a scanning transmission electron microscope equipped with a segmented detector.
Figure 12:
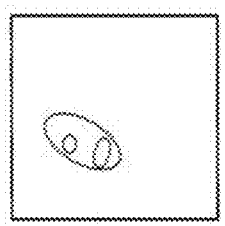
FIG. 12A is a bright-field STEM image obtained from a detector segment D1 shown in FIG. 11.
FIG. 12B is a bright-field STEM image obtained from a detector segment D2 shown in FIG. 11.
FIG. 12C is a bright-field STEM image obtained from a detector segment D3 shown in FIG. 11.
Figure 12:
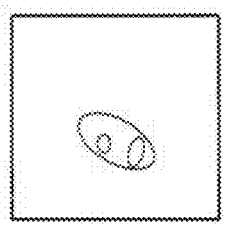
Figure 12:
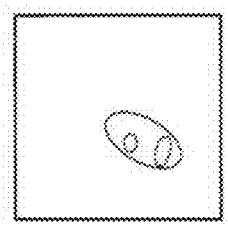
Figure 13:
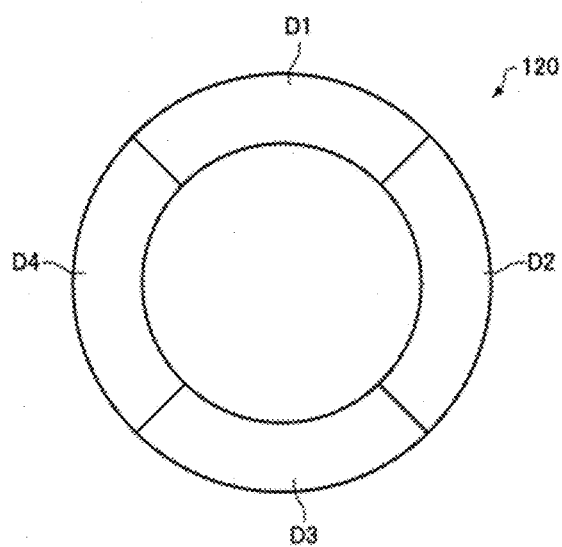
FIG. 13 is a schematic plan view of a segmented detector.

FIG. 8 is a flowchart illustrating one example of the method associated with the present embodiment to measure aberrations using an electron microscope. First, the active areas of the detector segments D1-D16 on which electrons transmitted through the sample S impinge are restricted using the aperture plate 30 for use for measuring aberrations. A bright-field STEM image is obtained for each of the detector segments D1-D16 (step S10).

In this step, capturing of a bright-field STEM image may be performed plural times while varying the type of the aberration-measuring aperture plate 30 (arrangement of the aperture openings 32) or the angular position of the aperture depending on the type of aberrations as described previously. Alternatively, capturing of a bright-field STEM images may be done plural times while varying the camera length or the angular position of the imaging system using the lenses in the imaging system of the electron microscope 100. The bright-field STEM images obtained from the respective detector segments D1-D16 are stored in the storage device 74 together with information about the convergent angle $\alpha$ and the azimuthal angle $\theta$ associated with the detector segments D1-D16 (positions of the respective aperture openings 32). The arithmetic section 66 reads bright-field STEM images from the storage device 74 and obtains bright-field STEM images from the detector segments D1-D16, respectively.

Then, aberrations are found from the obtained bright-field STEM images (step S11).

The arithmetic section 66 performs processing to find the aberration coefficients from the bright-field STEM images, using the above-described method. In particular, the arithmetic section 66 first computes relative positional deviations among the bright-field STEM images by mathematical processing (e.g., using a cross-correlation technique). If image capture is performed plural times to avoid drift effects, the arithmetic section 66 calculates only the positional deviations among the bright-field STEM images captured simultaneously. The arithmetic section 66 finds the aberration coefficients from the relative positional deviations among the bright-field STEM images. Because of the processing steps described so far, the aberrations can be measured.

After the arithmetic section 66 finds the aberration coefficients, the controller 62 performs processing to control the excitation currents supplied to the aberration correcting elements of the aberration corrector 40, based on the aberration coefficients calculated by the arithmetic section 66. Consequently, aberrations can be reduced.

The electron microscope 100 has the following features. The electron microscope 100 can reduce blurs of the bright-field STEM images obtained from the detector segments D1-D16 because the aperture plate 30 for use for measuring aberrations limits the active areas of the detector segments D1-D16 of the segmented detector 20 on which electrons impinge. Therefore, the arithmetic section 66 can accurately find positional deviations among the bright-field STEM images. Hence, aberrations can be measured accurately.

Furthermore, in the electron microscope 100, the aperture plate 30 for use for measuring aberrations restricts the active areas of the detector segments D1-D16 of the segmented detector 20 on which electrons impinge. This can bring about an improvement of the angular resolution of the segmented detector 20. Aberration coefficients up to higher orders, for example, can be measured.

In addition, in accordance with one aspect of the electron microscope 100, the aperture openings 32 of the aperture plate 30 for use for measuring aberrations are arranged differently according to the distance from the optical axis 2. Consequently, aberration terms which are different in angular dependence can be separated in the same way as when the segmented detector 20 is segmented more finely angularly.

Another aspect of the electron microscope 100 has plural aperture plates 30 for use for measuring aberrations, the aperture plates 30 being different from each other in arrangement of aperture openings 32. The aperture plates 30 can be used selectively according to the type of aberration to be measured. Thus, various aberrations can be measured easily and accurately. If the segmented detector has only a few number of detector segments, e.g., two detector segments, aberrations can be measured up to higher orders using the plural aberration-measuring aberrations 30 which are different in arrangement of aperture openings 32.

In accordance with another aspect of the present invention, in the aberration-measuring aperture plate 30 of the electron microscope 100, the N aperture openings 32 corresponding to the N detector segments arranged in the m-th layer as counted from the optical axis 2 are angularly shifted by 180/N degrees with respect to the N aperture openings 32 corresponding to the N detector segments located in the (m−1)-th layer as counted from the optical axis 2. Consequently, aberrations of higher orders can be measured as compared with the case where the aperture plate 30 for use for measuring aberrations is not used.

In accordance with a further aspect of the present invention, in the aberration-measuring aperture plate 30 of the electron microscope 100, the N aperture openings 32 corresponding to the N detector segments arranged in the m-th layer as counted from the optical axis 2 are not angularly shifted with respect to the N aperture openings 32 corresponding to the N detector segments located in the (m−1)-th layer as counted from the optical axis 2. Consequently, aberrations of lower orders can be measured accurately.

A method associated with a further embodiment of the present invention to measure aberrations includes the step (step S10) of limiting the active areas of the detector segments D1-D16 on which electrons transmitted through the sample S impinge by the use of the aperture plate 30 for measurements of aberrations and obtaining bright-field STEM images from the detector segments D1-D16, respectively, and the step (step S11) of finding aberrations from the obtained STEM images. Consequently, the aberrations can be measured easily and accurately as described previously.

A method associated with a still other embodiment of the present invention to measure aberrations includes the step of limiting the active areas of the detector segments D1-D16 on which electrons impinge by the use of a first aperture (such as the aberration-measuring aperture plate 30 shown in FIG. 5) and obtaining bright-field STEM images from the detector segments D1-D16, respectively, and the step of limiting the active areas of the detector segments D1-D16 on which electrons impinge by the use of a second aperture (such as the aberration-measuring aperture plate 30 shown in FIG. 7) that is different from the first aperture in arrangement of aperture openings and obtaining bright-field STEM images from the detector segments D1-D16, respectively. The use of the first and second apertures makes it possible to measure various aberrations easily and accurately. Furthermore, if the segmented detector has only a few number of detector segments, aberrations can be measured even up to higher orders through the use of the first and second apertures which are different in arrangement of aperture openings.

3. Modified Embodiments

It is to be understood that the present invention is not restricted to the foregoing embodiments but rather they can be practiced in various modified forms without departing from the gist and scope of the present invention.

For example, in one of the above-described embodiments, the segmented detector 20 having the detection surface divided into the plural detector segments is a device configured including the electron-to-light converter 22, optical transmission pathway 24, and light detectors 28 as shown in FIG. 2. The configuration of the segmented detector is not limited to this. For example, a CCD (charge-coupled device) camera may be used as the segmented detector for use in the electron microscope associated with the present invention.

For instance, the detection surface of a CCD camera consists of a two-dimensional array of pixels. This detection surface can be divided into plural detector segments embodying one of the above-described embodiments, and aberrations can be measured.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

Having thus described my invention with the detail and particularity required by the Patent Laws, what is desired protected by Letters Patent is set forth in the following claims.

The invention claimed is:

1. An electron microscope adapted to obtain scanning transmission electron microscope (STEM) images by detecting electrons transmitted through a sample, said electron microscope comprising:
   a segmented detector having a detection surface for detecting the electrons transmitted through the sample, the detection surface being divided into a plurality of detector segments; and
   an aperture plate for limiting active areas of the detector segments on which the electrons impinge, wherein said aperture plate has openings that are formed in a corresponding one-to-one manner to said detector segments.

2. The electron microscope as set forth in claim 1, wherein said openings in the aperture plate are smaller in size than their corresponding detector segments.

3. The electron microscope as set forth in claim 1, wherein said detection surface is angularly divided into N (where N is a positive integer) sectorial portions and concentrically divided into M (where M is a positive integer) layers about an optical axis, whereby said detector segments are N×M in number.

4. The electron microscope as set forth in claim 3, wherein said openings in the aperture include N openings corresponding to the N detector segments arranged in the m-th layer (where m=1, 2, . . . , M) as counted from the optical axis, and wherein the openings in the aperture plate are angularly spaced 360/N degrees from each other.

5. The electron microscope as set forth in claim 4, wherein said angularly spaced N aperture openings corresponding to the N detector segments disposed in the m-th layer as counted from the optical axis are angularly shifted by 180/N degrees with respect to the angularly spaced N aperture openings corresponding to the N detector segments disposed in the (m−1)-th layer as counted from the optical axis.

6. The electron microscope as set forth in claim 4, wherein said angularly spaced N aperture openings corresponding to the N detector segments disposed in the m-th layer as counted from the optical axis are not angularly shifted with respect to the angularly spaced N aperture openings corresponding to the N detector segments located in the (m−1)-th layer as counted from the optical axis.

7. The electron microscope as set forth in claim 1, wherein the holes in said aperture plate are configured for measuring aberrations.

8. The electron microscope as set forth in claim 1, wherein there is further provided an arithmetic section for finding aberrations, based on STEM images captured from the detector segments, respectively, while limiting active areas of the detector segments on which the electrons impinge by use of the aperture plate.

9. A method of measuring aberrations in an electron microscope equipped with a segmented detector having a detection surface divided into a plurality of detector segments and an aperture plate for limiting active areas of the detector segments on which the electrons impinge, wherein said aperture plate has openings that are formed in a corresponding one-to-one manner to said detector segments, said method comprising the steps of:

limiting active areas of the detector segments on which electrons transmitted through a sample impinge by use of aperture plates and obtaining STEM images from the detector segments, respectively; and finding the aberrations from the obtained STEM images.

10. The method of measuring aberrations in an electron microscope as set forth in claim 9, wherein said step of obtaining STEM images from the detector segments, respectively, comprises the steps of:

obtaining STEM images from the detector segments, respectively, while limiting the active areas of the detector segments by use of a first aperture plate; and obtaining STEM images from the detector segments, respectively, while limiting the active areas of the detector segments by use of a second aperture plate having aperture openings arranged differently from the aperture openings in the first aperture plate.

* * * * *